US007375663B2

(12) United States Patent
Liu et al.

(10) Patent No.: US 7,375,663 B2
(45) Date of Patent: May 20, 2008

(54) DATA SIMPLIFYING AND MERGING METHOD FOR A VOICE DECODING MEMORY SYSTEM

(75) Inventors: Te-Chung Liu, Hsinchu (TW); Hung-Ta Hsu, Hsinchu (TW)

(73) Assignee: Sunplus Technology Co. Ltd., Hsinchu (TW)

( * ) Notice: Subject to any disclaimer, the term of this patent is extended or adjusted under 35 U.S.C. 154(b) by 753 days.

(21) Appl. No.: 10/870,967

(22) Filed: Jun. 21, 2004

(65) Prior Publication Data

US 2005/0096919 A1 May 5, 2005

(30) Foreign Application Priority Data

Oct. 30, 2003 (TW) .............................. 92130226 A

(51) Int. Cl.

*H03M 7/00* (2006.01)
*G06F 7/00* (2006.01)
*G10L 19/00* (2006.01)

(52) U.S. Cl. ........................... 341/106; 707/2; 704/201

(58) Field of Classification Search ..................... None
See application file for complete search history.

(56) References Cited

U.S. PATENT DOCUMENTS

| | | | | |
|---|---|---|---|---|
| 5,657,454 | A * | 8/1997 | Benbassat et al. | 375/242 |
| 6,081,783 | A * | 6/2000 | Divine et al. | 704/500 |
| 6,433,709 | B1 * | 8/2002 | Oue | 341/67 |
| 7,046,175 | B1 * | 5/2006 | Subramaniam | 341/106 |
| 7,256,340 | B2 * | 8/2007 | Okazaki et al. | 84/604 |

* cited by examiner

*Primary Examiner*—David Hudspeth
*Assistant Examiner*—Matthew J. Sked
(74) *Attorney, Agent, or Firm*—Bacon & Thomas, PLLC

(57) ABSTRACT

A data simplifying and merging method for a voice decoding memory system is disclosed. The method includes the steps of: reading a voice data from a non-volatile memory in a memory system; performing logic operation on the voice data in order to obtain an index; fetching corresponding decoded voice data in a table of the memory system in accordance with the index; and adding the decoded voice data to the voice data in order to obtain an original voice data.

4 Claims, 8 Drawing Sheets

```
LDA    DATA    ;use the lower 4 bit
AND    #0FH    ;0000C3C2C1C0
EOR    TYPE    ;use the higher 4 bit、T7T6T5T4D3D2D1D0、Di=Ci XOR Ti
AND    #0FH    ;0000D3D2D1D0
EOR    TYPE    ;combine to form the index T7T6T5T4C3C2C1C0
```

FIG. 4 PRIOR ART

```
LDA    DATA    ;using the higher 4 bit
ROR    A
ROR    A
ROR    A
ROR    A
AND    #0FH    ;0000C7C6C5C4
EOR    TYPE    ;using the higher 4 bit of the stepT7T6T5T4D7D6D5D4
AND    #0FH
EOR    TYPE    ;combine to form the index T7T6T5T4C7C6C5C4
```

FIG. 5 PRIOR ART

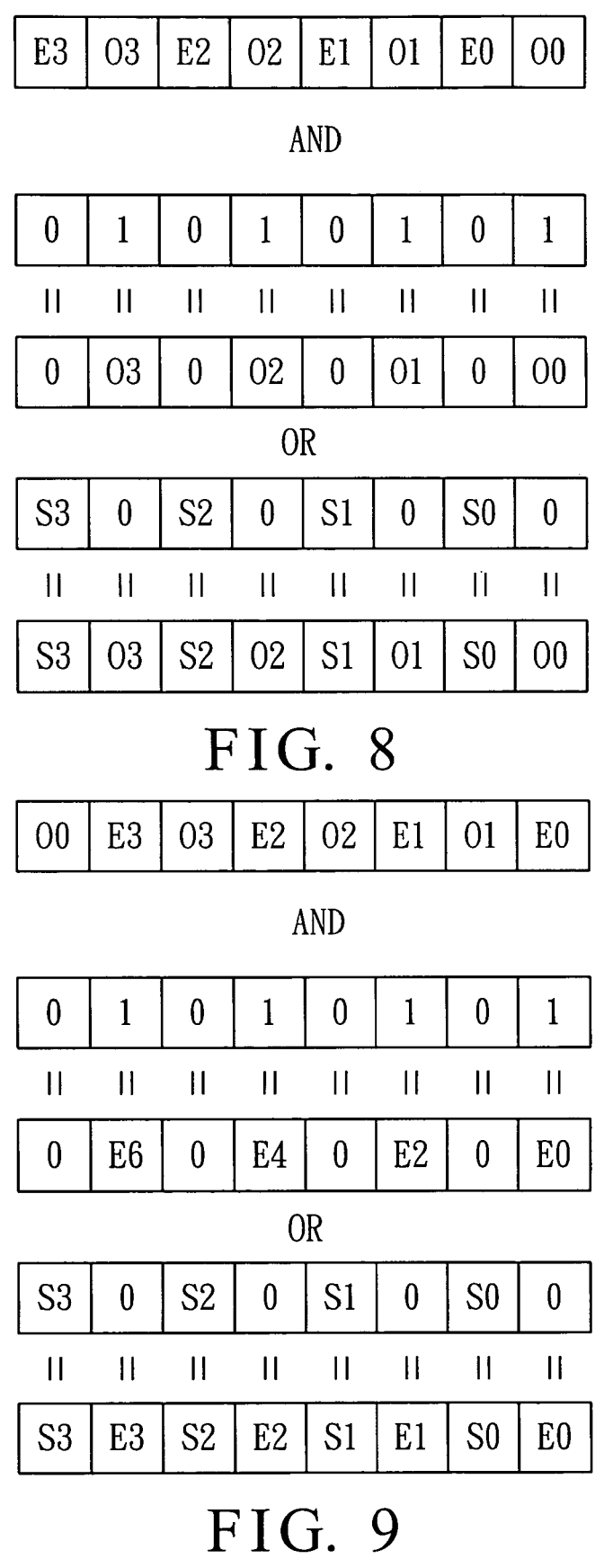

| | | | | | | | |
|---|---|---|---|---|---|---|---|
| E3 | 03 | E2 | 02 | E1 | 01 | E0 | 00 |

AND

| | | | | | | | |
|---|---|---|---|---|---|---|---|
| 0 | 1 | 0 | 1 | 0 | 1 | 0 | 1 |

|| || || || || || || ||

| | | | | | | | |
|---|---|---|---|---|---|---|---|
| 0 | 03 | 0 | 02 | 0 | 01 | 0 | 00 |

OR

| | | | | | | | |
|---|---|---|---|---|---|---|---|
| S3 | 0 | S2 | 0 | S1 | 0 | S0 | 0 |

|| || || || || || || ||

| | | | | | | | |
|---|---|---|---|---|---|---|---|
| S3 | 03 | S2 | 02 | S1 | 01 | S0 | 00 |

FIG. 8

| | | | | | | | |
|---|---|---|---|---|---|---|---|
| 00 | E3 | 03 | E2 | 02 | E1 | 01 | E0 |

AND

| | | | | | | | |
|---|---|---|---|---|---|---|---|
| 0 | 1 | 0 | 1 | 0 | 1 | 0 | 1 |

|| || || || || || || ||

| | | | | | | | |
|---|---|---|---|---|---|---|---|
| 0 | E6 | 0 | E4 | 0 | E2 | 0 | E0 |

OR

| | | | | | | | |
|---|---|---|---|---|---|---|---|
| S3 | 0 | S2 | 0 | S1 | 0 | S0 | 0 |

|| || || || || || || ||

| | | | | | | | |
|---|---|---|---|---|---|---|---|
| S3 | E3 | S2 | E2 | S1 | E1 | S0 | E0 |

FIG. 9

DATA SIMPLIFYING AND MERGING METHOD FOR A VOICE DECODING MEMORY SYSTEM

BACKGROUND OF THE INVENTION

1. Field of the Invention

The present invention relates to the technical field of voice data decoding and, more particularly, to a data simplifying and merging method for a voice decoding memory system.

2. Description of Related Art

For saving storage space, adaptive differential pulse code modulation (ADPCM) is frequently applied to process typical voice data before storage. FIG. 1 shows an ADPCM device. As shown, an 8-bit error signal e(n) is obtained by subtracting a previous voice signal ŝ(n) from an 8-bit input voice signal s(n). Next, a quantizer 100 quantizes the error signal e(n) and thus generates a 4-bit signal c(n) to output for storage. Next, a delay device 110 delays the 4-bit signal c(n). Then, the 4-bit signal c(n) is multiplied by a 4-bit step device 120 to obtain an 8-bit signal ŝ(n) for next subtraction as recited above. As such, only a quantized error signal is stored, thereby saving storage space.

The 4-bit signal c(n) after ADPCM coding is stored in a memory. When the 4-bit signal c(n) is to be used, as shown in FIG. 2, a multiplier 220 multiplies the signal c(n) by a 4-bit step device 200 to obtain an 8-bit signal d(n). Next, an adder 230 adds the 8-bit signal d(n) to a signal ŝ(n−1) and thus obtains an 8-bit signal ŝ(n). The original signal s(n) can be represented by the signal ŝ(n). The signal ŝ(n) is further delayed by a delay device 210 and thus generates a repeatedly delayed signal ŝ(n−1). However, the signal ŝ(n) is normally applied to lower-end products. Accordingly, upon the price consideration, the multiplier 220 in FIG. 2 seldom is used. Instead, the signal ŝ(n) is obtained by using a processor to look up a table. The 4-bit signal c(n) is stored in such a manner that two 4-bit signals c(n) are taken as a group for being stored in a byte, as shown in FIG. 3. The processor executes instructions shown in FIG. 4, thereby obtaining a pointer of the voice signal ŝ(n) at the lower four bits. A voice signal ŝ(n) is found by using the pointer to look up a predetermined table. Next, the processor executes instructions shown in FIG. 5, thereby obtaining a different pointer of the voice signal ŝ(n) at the upper four bits. Another voice signal ŝ(n) is found by using the different pointer to look up the predetermined table.

However, when the table is used to decode an ADPCM compression signal, it may occupy many processor resources. In addition, due to cost consideration, the processor may not be provided with multiplication instructions and Barrel Shift instruction (which can concurrently shift left or right n bits). Therefore, when the processor executes an instruction to shift right four bits, as shown in FIG. 5, it has to complete the instruction execution by shifting right four times, with one time one bit. Accordingly, the conventional ADPCM decoding method is not satisfactory and thus an improved data simplifying and merging method for a voice decoding memory system is desired.

SUMMARY OF THE INVENTION

The object of the present invention is to provide a data simplifying and merging method for a voice decoding memory system, which can avoid using multiplication or Barrel Shift instructions, thereby saving processor resources, simplifying codes and increasing decoding efficiency.

In accordance with one aspect of the present invention, there is provided a data simplifying and merging method for a voice decoding memory system. The voice decoding system includes a non-volatile memory having plural 2N-bit words for storing plural encoded voice data, plural step sizes and a table. Each encoded voice data has N bits, wherein odd voice data O[N−1:0] and even voice data E[N−1:0] are interlaced to form a 2N-bit data '$E_{N-1}O_{N-1} \ldots E_0O_0$' for being stored in a word of the non-volatile memory. The step sizes S[N−1:0] are arranged in every other bit to form a 2N-bit data '$S_{N-1}0 \ldots S_00$' for being stored in a word of the non-volatile memory. The table stores decoded differential voice data. The method comprises the steps of: (A) reading a word of encoded voice data from the non-volatile memory; (B) performing logic operation on the encoded voice data in order to obtain an index; (C) fetching corresponding decoded differential voice data in the table in accordance with the index; and (D) adding the decoded differential voice data to the encoded voice data in order to obtain an original voice data.

In accordance with another aspect of the present invention, there is provided a data simplifying and merging method for a voice decoding memory system. The system includes a non-volatile memory having plural 2N-bit words to store plural encoded voice data, plural step sizes and a table. Each encoded voice data has N bits, wherein odd and even voice data O[N−1:0] and E[N−1:0] perform logic operation respectively on step sizes offline for being stored in a word $X_{2N-1}X_{2N-2} \ldots X_1X_0$ of the non-volatile memory, where $X_{2i}=O_i \oplus S_i$, $X_{2i+1}=E_i \oplus S_i$, and $0 \leqq i \leqq N-1$. Each of the step sizes S[N−1:0] is arranged by repeating bits to form a 2N-bit data '$S_{N-1}S_{N-1} \ldots S_0\,S_0$' for being stored in a word of the non-volatile memory. The table stores decoded differential voice data. The method includes the steps of: (A) reading a word of encoded voice data from the non-volatile memory; (B) performing logic operation on the encoded voice data in order to obtain an index; (C) fetching corresponding decoded differential voice data in the table in accordance with the index; and (D) adding the decoded differential voice data to the encoded voice data in order to obtain an original voice data.

Other objects, advantages, and novel features of the invention will become more apparent from the following detailed description when taken in conjunction with the accompanying drawings.

BRIEF DESCRIPTION OF THE DRAWINGS

FIG. 4 shows the decoding codes for the lower four bits c(n−1) of FIG. 3;

FIG. 5 shows the decoding codes for the upper four bits c(n) of FIG. 3;

FIG. 8 is a flowchart of decoding the lower four bits of an encoded ADPCM signal in accordance with the invention;

FIG. 9 is a flowchart of decoding the upper four bits of an encoded ADPCM signal in accordance with the invention;

DETAILED DESCRIPTION OF THE PREFERRED EMBODIMENT

Figure 1:
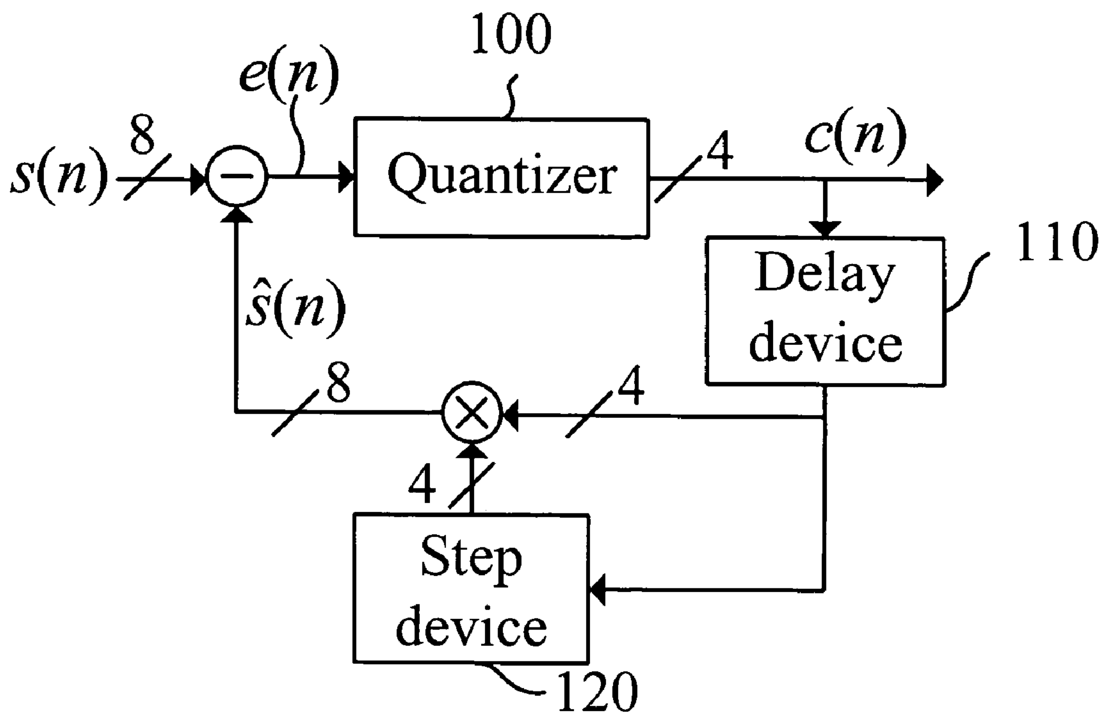
FIG. 1 PRIOR ART
FIG. 1 is a block diagram of a typical Adaptive Differential Pulse Code Modulation (ADPCM) encoder.
Figure 2:
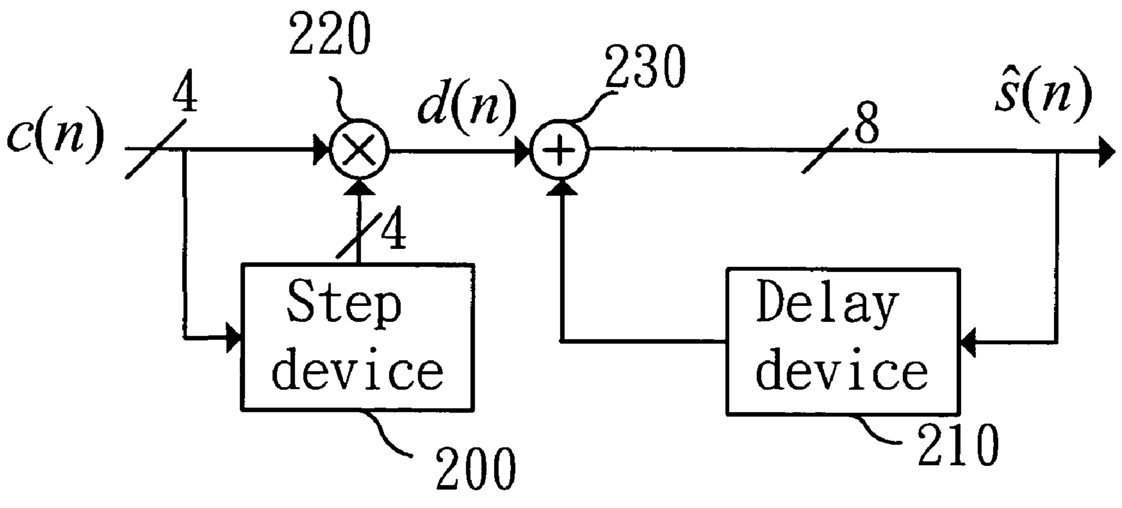
FIG. 2 PRIOR ART
FIG. 2 is a block diagram of a typical Adaptive Differential Pulse Code Modulation (ADPCM) decoder.
Figure 3:
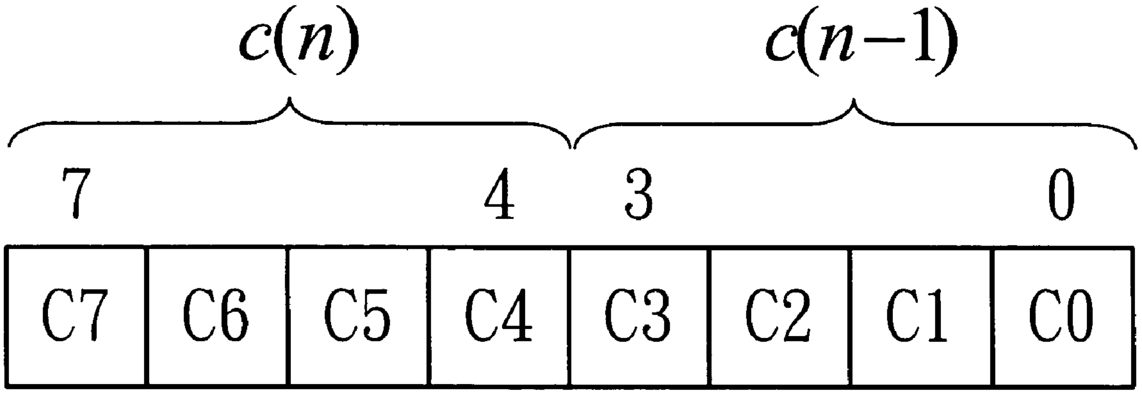
FIG. 3 PRIOR ART
FIG. 3 is a schematic diagram of a format used to store ADPCM signal.
Figure 6:
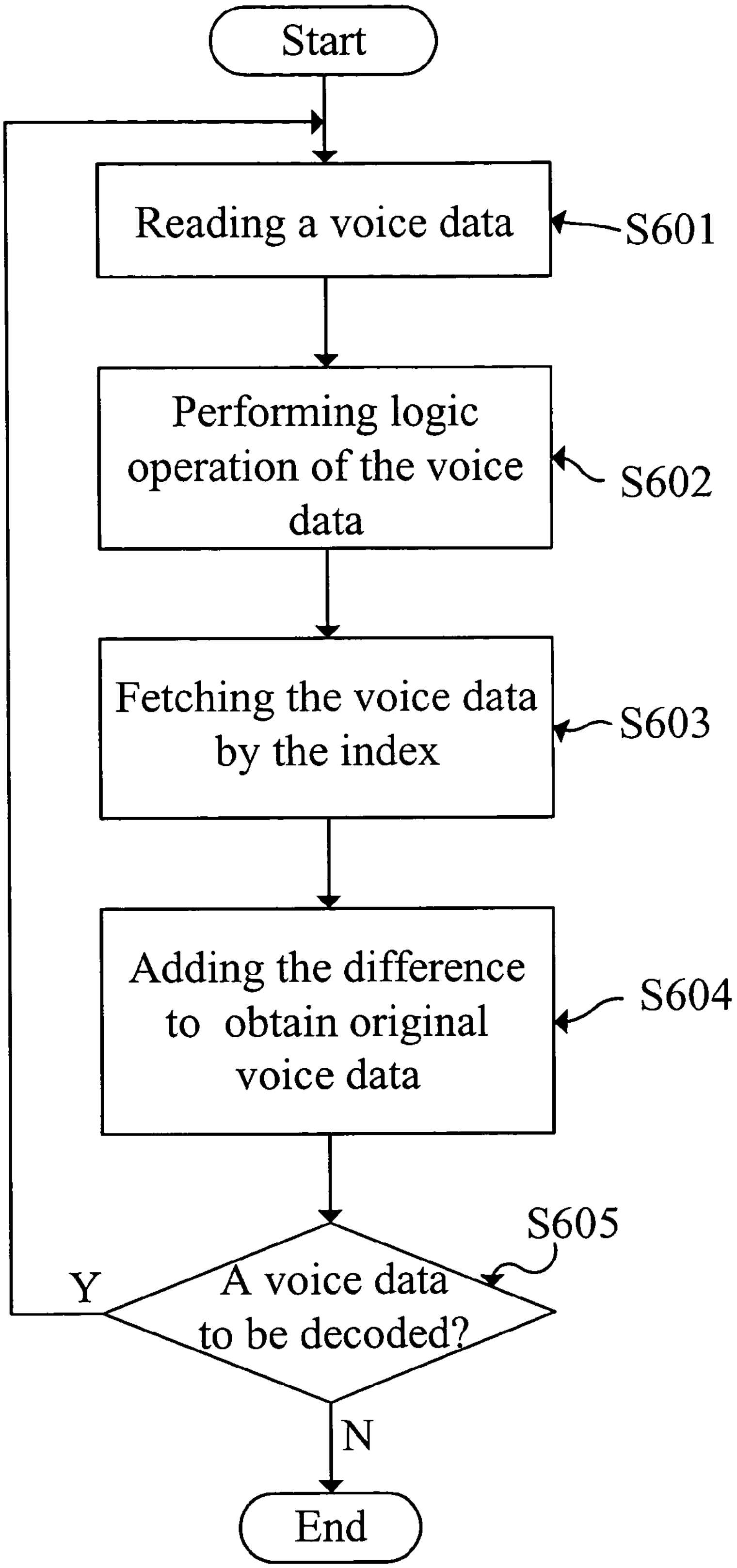
FIG. 6 is a flowchart of the data simplifying and merging method for a voice decoding memory system in accordance with the invention.
Figure 7:
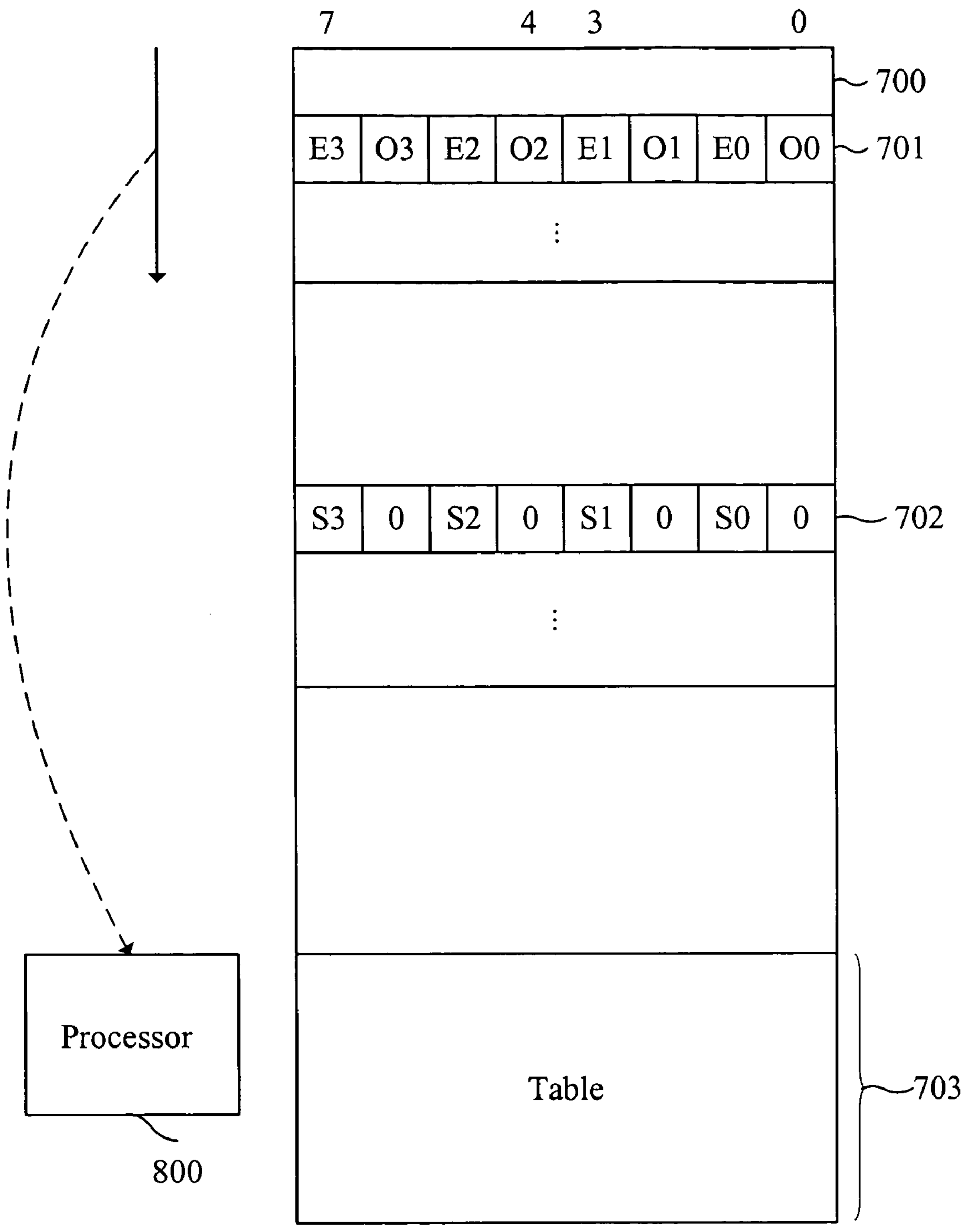
FIG. 7 is a schematic diagram of storing an encoded ADPCM signal in accordance with the invention.

FIG. 6 is a flowchart of the data simplifying and merging method for a voice decoding memory system in accordance with the invention. The voice decoding memory system includes a non-volatile memory. As shown in FIG. 7, the non-volatile memory has plural 2N-bit words 700 to store plural encoded voice data 701, plural step sizes 702 and a table 703. For illustrative purpose, the word 700 has a length of 8 bits (N=4). Namely, each word 700 is defined as a byte 700. The encoded voice data 701 is read sequentially by a processor 800 for decoding.

The length of each encoded voice data 701 is a nibble. Namely, each voice data 701 has N=4 bits. A byte 700 has odd and even voice data O[3:0] and E[3:0]. The odd voice data O[3:0] and the even voice data E[3:0] are interlaced to form a byte of $E_3O_3 \ldots E_0O_0$, which is stored in a byte 700 of the non-volatile memory. Each step size 702 has four effective bits S[3:0] to be arranged in every other bit as an 8-bit form of $S_30 \ldots S_00$, which is stored in a byte 700 of the non-volatile memory. The table 703 stores the corresponding decoded differential voice data of encoded voice data 701.

Referring again to FIG. 6, firstly, the processor 800 reads a word (i.e., a byte) of voice data $E_3O_3 \ldots E_0O_0$ from the non-volatile memory (step S601). In step 602, the processor 800 performs a logic operation respectively on odd and even parts of the voice data read, thereby obtaining an index for the odd part and an index for the even part. As shown in FIG. 8, the logic operation first takes an AND operation of the voice data $E_3O_3 \ldots E_0O_0$ and a logic value '01 . . . 01b', thereby obtaining a logic value '$0O_3 \ldots 0O$'. Next, the logic operation subsequently takes an OR operation of the logic value '$0O_3 \ldots 0O_0$' and a step size, thereby obtaining a logic value '$S_3O_3 \ldots S_0O_0$' as the index for the odd voice data. As shown in FIG. 9, the logic operation also rotation-shifts the voice data right one bit in order to subsequently take an AND operation with the logic value '01 . . . 01b', thereby obtaining a logic value '$0E_3 \ldots 0E_0$'. Next, the logic operation subsequently takes an OR operation of the logic value '$0E_3 \ldots 0E_0$' and a step size, thereby obtaining a logic value '$S_3E_3 \ldots S_0E_0$' as the index for the even voice data.

In step S603, the processor 800 fetches respectively odd and even decoded differential voice data in the table 703 based on the indexes '$S_3O_3 \ldots S_0O_0$' and '$S_3E_3 \ldots S_0E_0$'. In step S604, the processor 800 adds the odd and the even decoded differential voice data respectively to the odd and the even voice data, thereby obtaining respectively original odd and even voice data.

Step S605 determines if there still exists a voice data to be decoded: if yes, the procedure returns to step S601; and otherwise, the procedure is ended.

Figure 10:
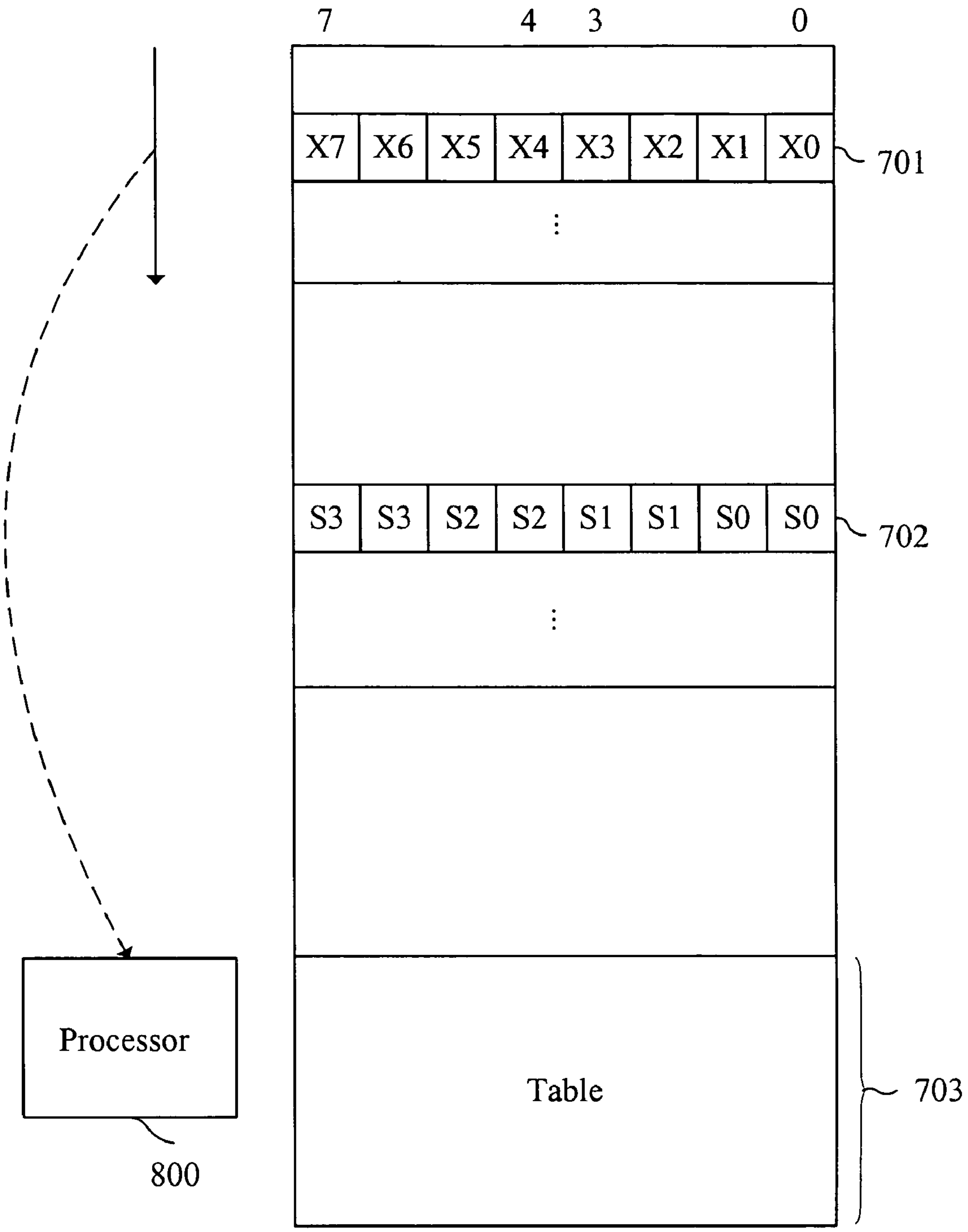
FIG. 10 is a schematic diagram of storing an encoded ADPCM signal in accordance with another embodiment of the invention.

FIG. 10 is a schematic diagram of storing an encoded ADPCM signal in accordance with another embodiment of the invention. As shown, the embodiment is similar to the previous one except that the odd and the even voice data respectively perform logic operation offline for being stored in 2N-bit word $X_{2N-1}X_{2N-2} \ldots X_1X_0$ of the non-volatile memory, where $X_{2i}=O_i \oplus S_i$, $X_{2i+1}=E_i \oplus S_i$, $0 \leqq i \leqq N-1$. In this embodiment, N=4, $X_0=O_0 \oplus S_0$, $X_1=E_0 \oplus S_0$, $X_2=O_1 \oplus S_1$, $X_3=E_1 \oplus S_1$, $X_4=O_2 \oplus S_2$, $X_5=E_2 \oplus S_2$, $X_6=O_3 \oplus S_3$, $X_7=E_3 \oplus S_3$, and the effective bits S[3:0] of each step 702 are arranged by repeating bits as an 8-bit form of $S_3S_3 \ldots S_0S_0$ for being stored in a byte 700 of the non-volatile memory.

Figure 11:
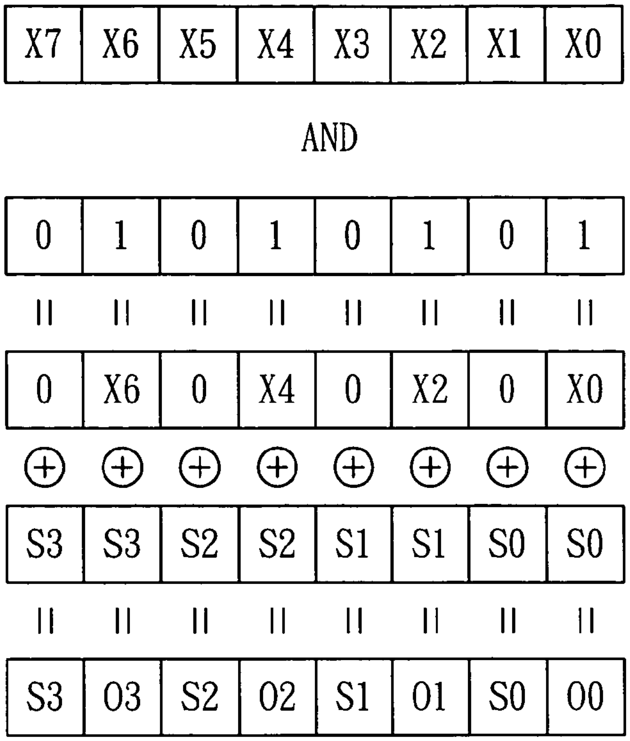
FIG. 11 is a schematic diagram of decoding the lower four bits of an encoded ADPCM signal in accordance with another embodiment of the invention.
Figure 12:
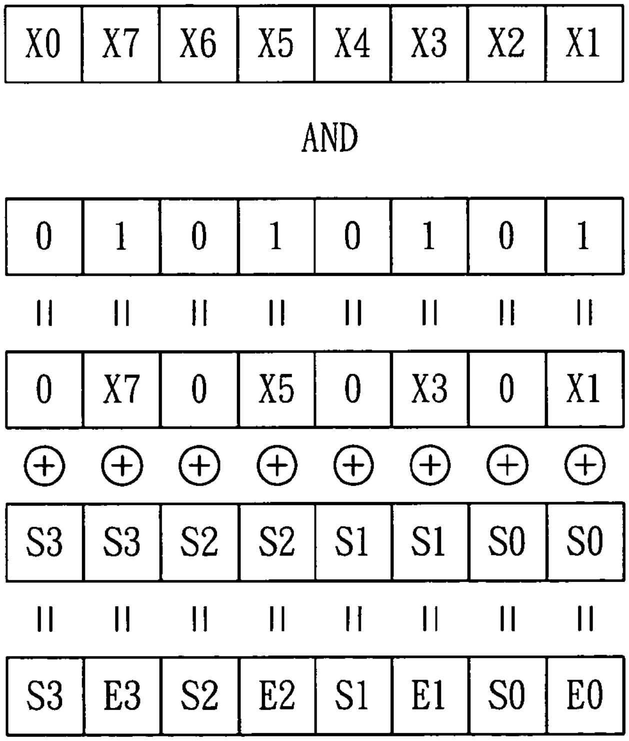
FIG. 12 is a schematic diagram of decoding the upper four bits of an encoded ADPCM signal in accordance with another embodiment of the invention.

According to the memory allocation in this embodiment, the decoding steps are same as those shown in FIG. 6 except for step S602. As shown in FIG. 11, in step S602, the processor 800 takes an AND operation of voice data $X_7X_6 \ldots X_1X_0$ read and the logic 01 . . . 01b in order to obtain a logic value '$0X_6 \ldots 0X_0$' and further takes an XOR operation of the logic value '$0X_6 \ldots 0X_0$' and a step size, thereby obtaining a logic value '$S_3O_3 \ldots S_0O_0$' as an index for odd voice data. As shown in FIG. 12, the processor 800 also rotation-shifts the voice data right one bit as a logic value '$X_0X_7 \ldots X_2X_1$' and takes an AND operation of the logic value '$X_0X_7 \ldots X_2X_1$' and a logic value '01 . . . 01b' in order to obtain a logic value '$0E_7 \ldots 0E_1$' to further take an XOR operation with a step size, thereby obtaining a logic value '$S_3E_3 \ldots S_0E_0$' as an index for even voice data.

In view of the foregoing, it is known that the invention applies a special arrangement in a memory to voice data, so that ADPCM decoding can read out the data without the need for multiplication instructions or Barrel Shift instructions. As such, the advantages of requiring fewer processor resources and simpler codes are obtained, thereby further increasing decoding efficiency.

Although the present invention has been explained in relation to its preferred embodiment, it is to be understood that many other possible modifications and variations can be made without departing from the spirit and scope of the invention as hereinafter claimed.

What is claimed is:

1. A data simplifying and merging method for a voice decoding memory system, the system including a non-volatile memory having plural 2N-bit words to store plural encoded voice data, plural step sizes and a table, wherein each encoded voice data has N bits representative of an odd voice data or an even voice data, the odd voice data O[N−1:0] and the even voice data E[N−1:0] are interlaced to form a 2N-bit data '$E_{N-1}O_{N-1} \ldots E_0O_0$' for being stored in a word of the non-volatile memory, the step sizes S[N−1:0] being arranged in every other bit to form a 2N-bit data '$S_{N-1}0 \ldots S_00$' for being stored in a word of the non-volatile memory, the table storing decoded differential voice data, the method comprising the steps of:

(A) reading a word of encoded voice data from the non-volatile memory;

(B) performing logic operation on the encoded voice data in order to obtain an index, wherein the logic operation first takes an AND operation of the voice data read and a logic '01 . . . 01b' to thus generate a result and then takes an OR operation of the result and a step size, thereby obtaining an index for odd voice data, or the logic operation shifts the voice data read right one bit in order to subsequently take an AND operation with a logic '01 . . . 01' and further take an OR operation with a step size, thereby obtaining an index for even voice data;

(C) fetching corresponding decoded differential voice data in the table in accordance with the index; and (D) adding the decoded differential voice data to the encoded voice data in order to obtain an original voice data.

2. The method as claimed in claim 1, wherein steps (A) to (D) are repeated until no more voice data is decoded.

3. A data simplifying and merging method for a voice decoding memory system, the system including a non-volatile memory having plural 2N-bit words to store plural encoded voice data, plural step sizes and a table, wherein each encoded voice data has N bits representative of an odd voice data or an even voice data, the odd voice data O[N_1:0] and the even voice data E[N−1:0] are performed logic operation respectively on step sizes offline for being stored in a word $X_{2N-1}X_{2N-2} \ldots X_1X_0$ of the non-volatile memory, where $X_{2i}=O_i \oplus S_i$, $X_{2i+1}=E_i \oplus S_i$, and $0 \leqq i \leqq N-1$, each of the step sizes S[N−1:0] being arranged by repeating bits to form a 2N-bit data '$S_{N-1}S_{N-1} \ldots S_0S_0$' for being stored in a word of the non-volatile memory, the table storing decoded differential voice data, the method comprising the steps of:

(A) reading a word of encoded voice data from the non-volatile memory;

(B) performing logic operation on the encoded voice data in order to obtain an index, wherein the logic operation first takes an AND operation of the voice data read and a logic '01 . . . 01' to generate a result and then takes an XOR operation of the result and a step size, thereby obtaining an index for odd voice data, or the logic operation shifts the voice data read right one bit in order to subsequently take an AND operation with a logic '01 . . . 01' and further takes an XOR operation with a step size, thereby obtaining an index for even voice data;

(C) fetching corresponding decoded differential voice data in the table in accordance with the index; and (D) adding the decoded differential voice data to the encoded voice data in order to obtain an original voice data.

4. The method as claimed in claim 3, wherein steps (A) to (D) are repeated until no more voice data is decoded.

* * * * *